United States Patent [19]
Van Horn

[11] Patent Number: 5,874,856
[45] Date of Patent: Feb. 23, 1999

[54] FEED FORWARD AMPLIFIER

[75] Inventor: Mark I. Van Horn, Arlington, Tex.

[73] Assignee: Motorola, Inc., Schaumburg, Ill.

[21] Appl. No.: 885,749

[22] Filed: Jun. 30, 1997

[51] Int. Cl.$^6$ ..................................................... H03F 1/32
[52] U.S. Cl. ............................. 330/151; 330/149; 455/63
[58] Field of Search ................................... 330/149, 151; 332/107, 123, 124, 159, 160, 161; 375/297; 435/63

[56] References Cited

U.S. PATENT DOCUMENTS 4,389,618  6/1983  Bauman ............................... 330/151 X

*Primary Examiner*—James B. Mullins
*Attorney, Agent, or Firm*—Kenneth Haas; Mario J. Donato, Jr.

[57] ABSTRACT

A feed forward amplifier (200) comprises a main signal path (201), an error signal path (203), and a third signal path (205). In the preferred embodiment of the present invention, the third signal path (205) comprises a gain and phase adjuster (245), delay circuitry (249), summing circuitry (251), and an error cancellation detector (255). The third signal path (205) is designed to match passive components in a component section (207) of the main signal path (201) to the error signal path (203). Gain and phase adjustments are made by the gain and phase adjuster (235) to minimize the RSSI of the error components within the input signal (253). Because passive components in the third signal path (205) are matched to those of the component assembly (207) in the main signal path (201), the minimization of RSSI of the error components within the input signal (253) results in a properly phase and gain adjusted error signal (243) for maximum error cancellation, without utilizing a pilot-tone generator utilized within prior art error cancellation techniques.

11 Claims, 3 Drawing Sheets

5,874,856

FEED FORWARD AMPLIFIER

FIELD OF THE INVENTION

The present invention relates generally to feed forward amplifiers and, in particular, to a method and apparatus for controlling gain and phase of an error signal in a feed forward amplifier.

BACKGROUND OF THE INVENTION

Feed forward amplifiers are known in the art. In general, feed forward amplifiers separate out distortion and intermodulation components generated by a power amplifier to create an error signal. The error signal is then added to the power amplifier's output with a gain, phase, and delay adjusted for maximum cancellation of the intermodulation and distortion. The amount of distortion reduction available using feed forward technology is limited by the accuracy of gain and phase adjustments of the error signal. Prior art feed forward amplifiers have attempted to increase the accuracy of the gain and phase adjustments by injecting a test signal, or pilot, into the main signal. The test signal is then utilized to adjust the gain and phase of the error cancellation signal. Such a prior-art feed forward amplifier, generally designated 100, is shown in FIG. 1.

As shown in FIG. 1, input signal 101 is split by directional coupler 102, causing signal 101 to be directed towards main signal path 103 and error signal path 105. Test signal 107, or pilot tone 107 (generated by pilot tone generator 106), is injected via summer 109, into main signal path 103 of amplifier 100. Both input signal 101 and pilot tone 107 are amplified by main amplifier 113, and the output signal is split, with one branch input to error signal path 105, where it is subtracted from input signal 101 to produce an error signal 112. The magnitude of the pilot tone, when detected at pilot tone receiver 104, is used by pilot tone receiver 104 to adjust the gain and phase of the error signal 112 such that the addition of gain and phase adjusted error signal 114 and amplified signal 116 result in output signal 118 that has both the pilot tone and the distortion introduced by amplifier 113 substantially eliminated. In particular, gain and phase controls are adjusted by gain and phase adjuster 117 until a received signal strength indication (RSSI) of pilot tone 107 (received at pilot tone receiver 104) is minimized, causing the gain and phase of amplified signal 116 traveling through main path 103 to be properly matched with the gain and phase of adjusted error signal 114 traveling through error path 105.

The problem with utilizing a pilot tone for controlling the gain and phase of the error signal is that the addition of a pilot tone generator adds appreciable cost, board space, and isolation requirements to any feed forward amplifier. Therefore a need exists for a method and apparatus to accurately control the gain and phase of an error signal without the added cost, board space, and current drain required by prior art error cancellation methods.

DETAILED DESCRIPTION OF THE DRAWINGS

Figure 1:
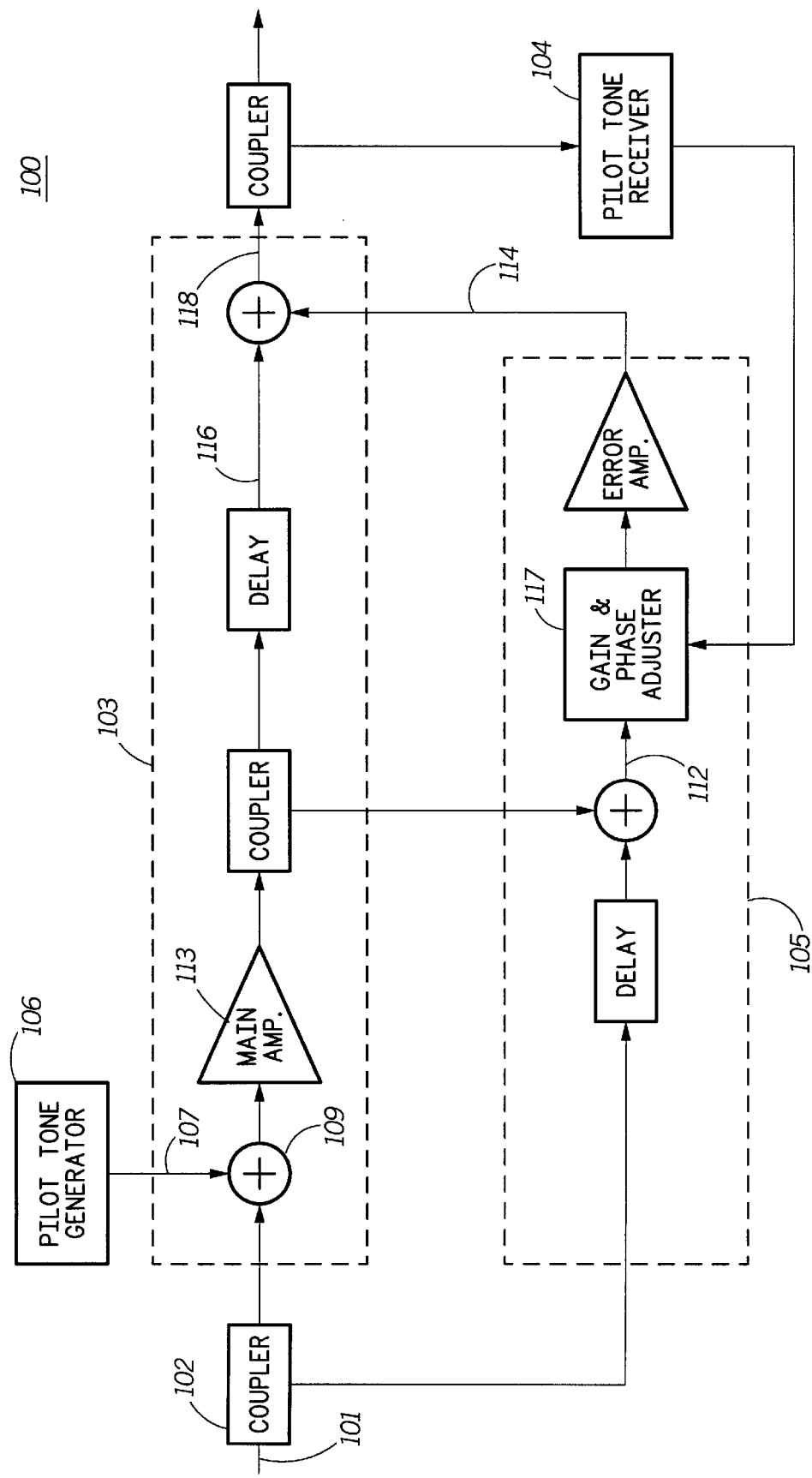
FIG. 1 is a prior-art feed forward amplifier.

Stated generally, a feed forward amplifier comprises a main signal path, an error signal path, and a third signal path. In the preferred embodiment of the present invention, the third signal path comprises a gain and phase adjuster, delay circuitry, summing circuitry, and an error cancellation detector. The third signal path is designed to match passive components in a component section of the main signal path to the error signal path. Gain and phase adjustments are made by the gain and phase adjuster to minimize the RSSI of the error components within the input signal. Because passive components in the third signal path are matched to those of the component assembly in the main signal path, the minimization of RSSI of the error components within the input signal results in a properly phase and gain adjusted error signal for maximum error cancellation, without utilizing a pilot-tone generator utilized within prior art error cancellation techniques.

The present invention encompasses a method for adjusting a gain and a phase of an error signal in a feed forward amplifier. The method comprises the steps of amplifying an input signal in a first component assembly to produce an amplified signal with error components and generating an error signal in a second component assembly from the amplified signal with error components. Next, the error signal is gain and phase adjusted in a third component assembly to produce a gain and phase adjusted error signal output from the third component assembly substantially equal to a gain and phase of the error signal had it been passed through the first component assembly. The error signal is gain and phase adjusted in the second component assembly based on the gain and phase adjusted error signal output from the third component assembly to produce a gain and phase adjusted error signal output from the second component assembly wherein the error signal output from the second component assembly substantially cancels the signal output from the third component assembly when added together. Finally the error signal output from the second component assembly is subtracted from the amplified signal with error components to produce an amplified signal substantially free from error components.

The present invention additionally encompasses a method for controlling a gain and a phase of an error signal in a feed forward amplifier. The method comprises the steps of passing a signal through a main path of the feed forward amplifier to create an amplified signal having error components, and passing the error components of the amplified signal through an error path of the feed forward amplifier to create a first gain and phase adjusted error signal. Next, the error components are passed through a third path in the feed forward amplifier to create a second gain and phase adjusted error signal substantially equal to a gain and a phase of the error components had they been passed through the main path of the feed forward amplifier. The first gain and phase adjusted error signal is compared to the second gain and phase adjusted error signal and the gain and phase of the first gain and phase adjusted error signal is controlled based on the comparison. Finally the first gain and phase adjusted error signal is subtracted from the amplified signal having error components.

Finally, the present invention encompasses a feed forward amplifier comprising a first component assembly having a signal as an input and outputting an amplified signal with error components, a second component assembly having the amplified signal with error components as an input and outputting an error signal and a first amplified and phase adjusted error signal substantially equal to a second amplified and phase adjusted error signal, and a third component assembly having passive components matched to passive components within the first component assembly, the third component assembly having the error signal as an input and outputting the second amplified and phase adjusted error signal.

Figure 2:
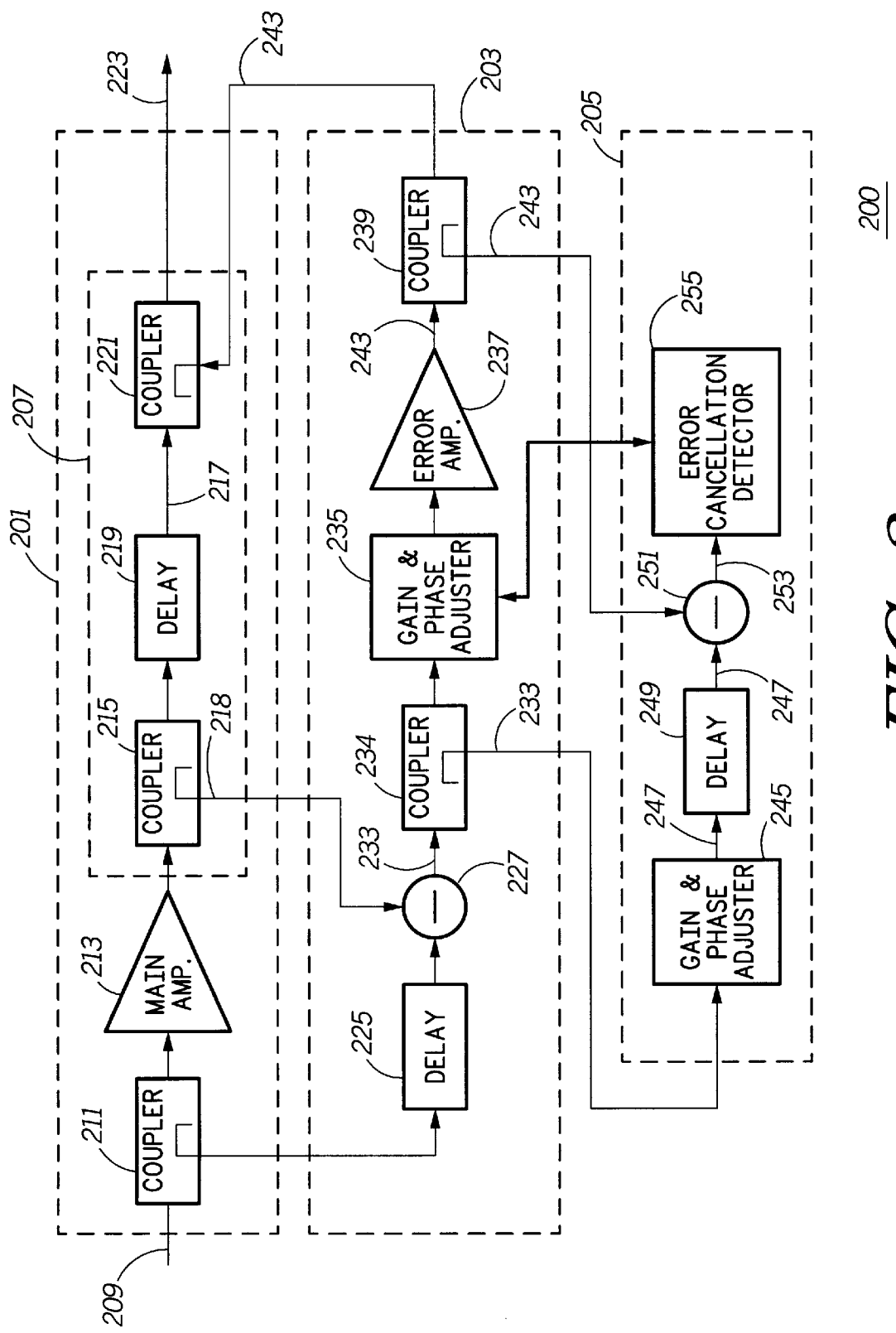
FIG. 2 is a feed forward amplifier in accordance with the preferred embodiment of the present invention.

Referring to FIG. 2, there is shown in block diagram form, a feed forward amplifier 200 in accordance with the preferred embodiment of the present invention. Amplifier 200 comprises main signal path 201, error signal path 203, and third signal path 205. In the preferred embodiment of the present invention, third signal path 205 comprises gain and phase adjuster 245, delay circuitry 249, summing circuitry 251, and error cancellation detector 255. Additionally, in the preferred embodiment of the present invention, third signal path 205 is designed to match passive components in component section 207 of main signal path 201 to the error signal path 203. In particular, a signal passed through the through port of coupler 215 through delay 219 and the through port of coupler 221 must be equal in magnitude but opposite in phase to the signal if passed through coupled path of coupler 215, summer 227, the coupled port of coupler 234, gain and phase adjuster 245, delay 249, and summer 251.

In the preferred embodiment of the present invention several steps are taken to ensure gain and phase matching of passive components in third signal path 205 to those of main signal path 201. Firstly, matching is aided by gain and phase adjuster 245 to reduce error in the passive components during the manufacture of amplifier 200. Gain and phase adjuster 235 is factory tuned to ensure proper matching of component assembly 207 and third path 205. Additionally, gain and phase adjuster 235 is adjusted to account for gain and phase perturbations of the through port of coupler 239, summer 251 and the coupled port of coupler 221. Finally, whenever possible, like components in each path are made from the same material, and preferably on the same board in a single board amplifier.

Operation of amplifier 200 in accordance with the preferred embodiment of the present invention occurs as follows: Input signal 209 is routed between main signal path 201 and error signal path 203 by directional coupler 211. In main signal path 201, input signal 209 is amplified in main amplifier 213 and directed to coupler 215, delay 219, and summing coupler 221. As previously mentioned, distortion and intermodulation components will be introduced by main amplifier 213. Therefore, the circuit of FIG. 2 is designed to remove substantially all distortion and intermodulation prior to output 223. In this effort, the sample of input signal 209 provided by the coupled path of coupler 211 is delayed by delay circuit 225, summed with signal 218 (a sample of amplifier output 217 from the coupled port of coupler 215), then phase and gain adjusted by phase and gain adjuster 235 without appreciable distortion being introduced. In the preferred embodiment of the present invention time delay of delay 225 is set to compensate for the signal delay through main amplifier 213 and directional coupler 215.

Continuing, summing circuitry 227 permits signal 218, (having distortion components) to be subtracted from the sample of input signal 209 (having no distortion components), resulting in error signal 233 containing primarily distortion components of signal 217. In particular, if the amplitude and the phase of signal 217 output from coupler 215 is properly adjusted the carrier components of signal 218 from directional coupler 215 will cancel the carrier components of sampled input signal 209, resulting in an error signal 233 at the output of summing circuitry 227. This process is often referred to as carrier cancellation.

Thereafter, the amplitude and the phase of error signal 233 is modified in gain and phase adjuster 235, amplified in error amplifier 237 resulting in amplified and phase adjusted error signal 243. Signal 243 is routed to directional coupler 239 where it is subtracted from the output of main amplifier 213 via summing coupler 221. In the preferred embodiment of the present invention, prior to subtraction, signal 217 is time delayed via delay circuit 219. The time delay of delay circuit 219 is set to compensate for the signal delay through the coupled port of coupler 215, the summing circuit 227, the through port of directional coupler, gain and phase adjuster 235 error amplifier 237, and coupler 239. If the amplitude and the phase of error signal 233 is properly adjusted, the distortion component of the main signal path will be canceled, resulting in a clean signal at the main signal path output 223.

As discussed above, the amount of distortion reduction available at output 223 using feed forward technology is limited by the accuracy of gain and phase adjustments of error signal 233. In order to achieve optimal distortion cancellation, gain and phase adjuster 235 must be controlled to produce a clean output signal, i.e. one that is substantially free of the distortion created by main amplifier 213. In the preferred embodiment of the present invention proper gain and phase control takes place by gain and phase adjuster 235 with the gain and phase adjusted to reduce error components within signal 253. In particular, third signal path 205 is utilized by gain and phase adjuster 235 to calculate a proper gain and phase adjustment by minimizing a received signal strength indication (RSSI) of error components within signal 253. With proper gain and phase adjustments determined, modification of error signal 233 can occur so that the distortion component of the main signal path will be canceled, resulting in a clean signal at the main signal path output 223.

Operation of third signal path 205 in accordance with the preferred embodiment of the present invention occurs as follows: Error signal 233, containing primarily distortion components of signal 217 is sent to third signal path 205 via directional coupler 231. Error signal 233 is properly gain and phase adjusted via gain and phase adjuster 245 and delayed by delay circuitry 249. As mentioned above, passive components in third signal path 205 are matched to those of main signal path 201. In particular, a signal passed through those components within component assembly 207 of main signal path 201 will be delayed substantially equal to the signal passed through third signal path 205. As discussed above, several steps are taken to ensure gain and phase matching of passive components in third signal path 205 to those of component assembly 207 of main signal path 201. Firstly, matching is aided by gain and phase adjuster 245 to reduce error in the passive components during the manufacture of amplifier 200. Finally, whenever possible, like components in each path are made from the same material, and preferably on the same board in a single board amplifier.

Continuing, amplified and phase adjusted error signal 243 is subtracted from amplitude and phase adjusted error signal 247 by summing circuitry 251. The resulting signal 253 is input to error cancellation detector where the amplitude of the remaining error components within signal 253 are analyzed. In the preferred embodiment of the present invention gain and phase adjustments are made by gain and phase adjuster 235 to minimize the RSSI of the error components within signal 253. Because passive components in third signal path 205 are matched to those of component assembly 207 in main signal path 201, the minimization of RSSI of the error components within signal 253 results in a properly phase and gain adjusted error signal 243 for maximum error cancellation, without utilizing a pilot-tone generator utilized within prior art error cancellation techniques. The result of eliminating the pilot-tone generator results in a less costly feed forward amplifier having a lower cost and greater board space than prior-art feed forward amplifiers.

Figure 3:
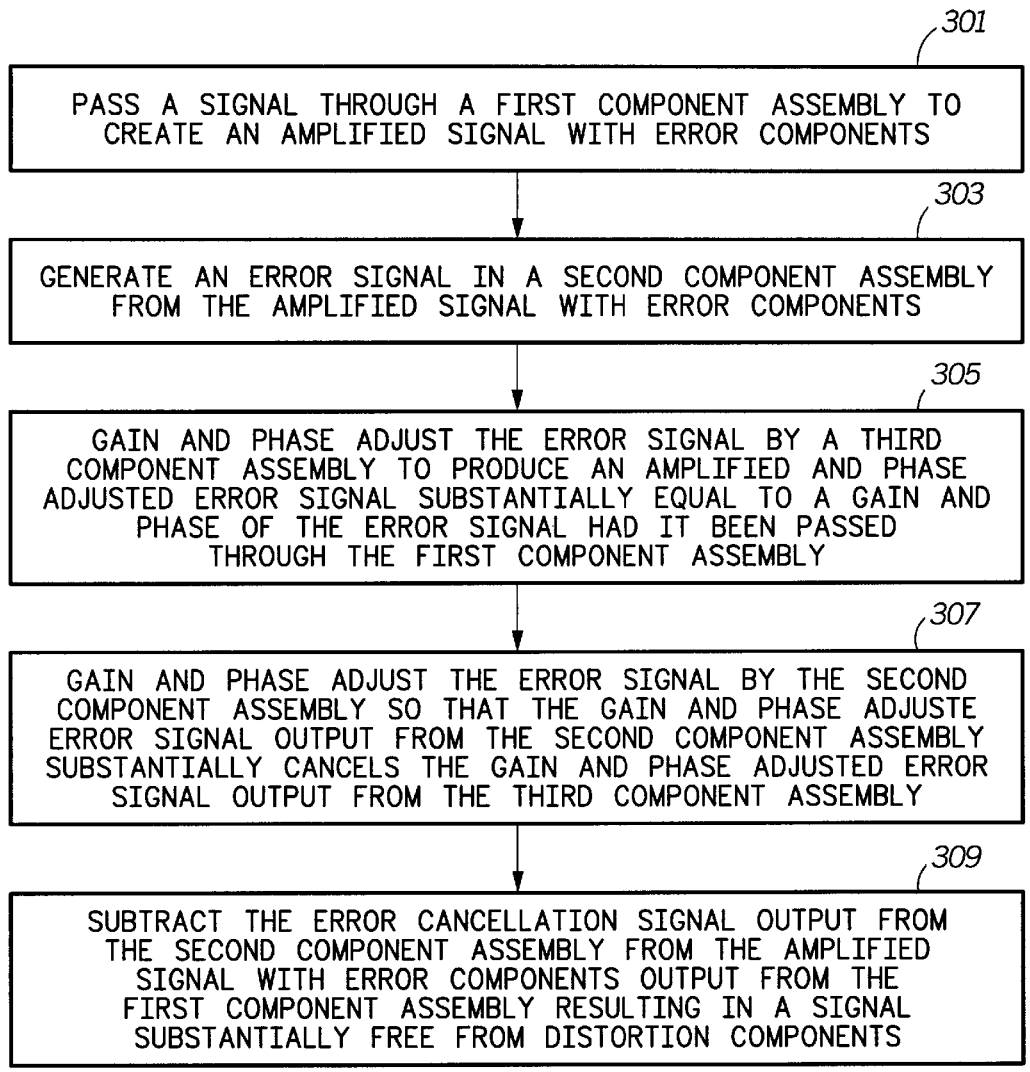
FIG. 3 is a flow chart illustrating those steps necessary for operation of the feed forward amplifier of FIG. 2 in accordance with the preferred embodiment of the present invention.

FIG. 3 is a flow chart illustrating those steps necessary for operation of the feed forward amplifier of FIG. 2 in accordance with the preferred embodiment of the present invention. The logic flow starts at step 301 where a signal is passed through a first component assembly to create an amplified signal with error components. In particular, signal 209 is passed through main path 201 to create amplified signal 217 with error components. As discussed above, amplified signal 217 contains distortion and intermodulation components generated by power amplifier 213 that feed forward techniques substantially eliminate. Next at step 303 an error signal is generated from the amplified signal with error components. In particular, error signal 233 is created by subtracting amplified signal 218, a sampled signal of 217 from coupler 215, from the sample of input signal 209 from coupler 211.

Continuing, at step 305 the error signal is gain and phase adjusted by a third component assembly to produce an amplified and phase adjusted error signal proportional to the gain and phase of the error signal had it been passed through the first component assembly. In particular, error signal 233 is gain and phase adjusted by third signal path 205 to substantially equal the gain and phase that would be achieved had error signal 233 been passed through component assembly 207 of main signal path 201 minus the gain and phase shifts introduced by the coupled path of coupler 215, summer 227, coupler 234 and summer 221. At step 307 the error signal is gain and phase adjusted by a second component assembly based on the amplified and phase adjusted error signal output from the third component assembly so that the gain and phase adjusted error signal output from the second component assembly substantially cancels the gain and phase adjusted error signal output from the third component assembly. In particular, error signal 233 is gain and phase adjusted within second signal path 203 by gain and phase adjuster 235 to minimize the RSSI of the error components within signal 253. Finally, at step 309 the error signal output from the second component assembly is subtracted from the amplified signal with error components output from the first component assembly, resulting in a signal substantially free from distortion components. In particular, at step 309 amplified and phase adjusted error signal 243 output from error signal path 203 is routed to directional coupler 239 where it is subtracted from the output of main amplifier 213 via summing circuitry 221 resulting in a clean signal at the main signal path output 223.

While the invention has been particularly shown and described with reference to a particular embodiment, it will be understood by those skilled in the art that various changes in form and details may be made therein without departing from the spirit and scope of the invention.

What is claimed is:

1. A method for adjusting a gain and a phase of an error signal in a feed forward amplifier, the method comprising the steps of:

amplifying an input signal in a first component assembly to produce an amplified signal with error components;

generating an error signal in a second component assembly from the amplified signal with error components;

gain and phase adjusting the error signal in a third component assembly to produce a gain and phase adjusted error signal output from the third component assembly substantially equal to a gain and phase of the error signal had it been passed through the first component assembly;

gain and phase adjusting the error signal in the second component assembly based on the gain and phase adjusted error signal output from the third component assembly to produce a gain and phase adjusted error signal output from the second component assembly wherein the error signal output from the second component assembly substantially cancels the signal output from the third component assembly when added together; and subtracting the error signal output from the second component assembly from the amplified signal with error components to produce an amplified signal substantially free from error components.

2. The method of claim 1 wherein the step of amplifying the input signal in the first component assembly comprises the step of amplifying the signal in a main signal path in the feed forward amplifier.

3. The method of claim 1 wherein the step of generating the error signal in the second component assembly comprises the step of generating the error signal in an error signal path of the feed forward amplifier.

4. The method of claim 1 wherein the step of generating the error signal comprises the step of subtracting the input signal from the amplified signal with error components.

5. A method for controlling a gain and a phase of an error signal in a feed forward amplifier, the method comprising the steps of:

passing a signal through a main path of the feed forward amplifier to create an amplified signal having error components;

passing the error components of the amplified signal through an error path of the feed forward amplifier to create a first gain and phase adjusted error signal;

passing the error components through a third path in the feed forward amplifier to create a second gain and phase adjusted error signal substantially equal to a gain and a phase of the error components had they been passed through the main path of the feed forward amplifier;

comparing the first gain and phase adjusted error signal to the second gain and phase adjusted error signal;

controlling the gain and phase of the first gain and phase adjusted error signal based on the comparison; and subtracting the first gain and phase adjusted error signal from the amplified signal having error components.

6. The method of claim 5 wherein the step of comparing the first gain and phase adjusted error signal to the second gain and phase adjusted error signal comprises the step of subtracting the first gain and phase adjusted error signal from the second gain and phase adjusted error signal to produce the comparison.

7. The method of claim 5 wherein the step of controlling the gain and the phase of the first gain and phase adjusted error signal based on the comparison comprises the step of selecting a gain and phase of the first gain and phase adjusted error signal minimizes a difference between the first gain and phase adjusted error signal and the second gain and phase adjusted error signal.

8. A feed forward amplifier comprising:

a first component assembly having a signal as an input and outputting an amplified signal with error components;

a second component assembly having the amplified signal with error components as an input and outputting an error signal and a first amplified and phase adjusted error signal substantially equal to a second amplified and phase adjusted error signal; and a third component assembly having passive components matched to passive components within the first component assembly, the third component assembly having the error signal as an input and outputting the second amplified and phase adjusted error signal.

9. The feed forward amplifier of claim 8 wherein the first component assembly comprises a main amplifier having the signal as an input and outputting the amplified signal with error components.

10. The feed forward amplifier of claim 8 wherein the first component assembly comprises summing circuitry for receiving the amplified signal with error components and the first error signal, and outputting an amplified signal with no error components.

11. The feed forward amplifier of claim 8 further comprising a gain and phase adjuster located within the third component assembly utilized for matching gain and phase characteristics of passive components within the third component assembly to passive components in the first component assembly.

* * * * *